(12) United States Patent
Akahane et al.

(10) Patent No.: US 10,010,985 B2
(45) Date of Patent: Jul. 3, 2018

(54) COMPONENT ASSEMBLY JIG (71) Applicant: TOPY FASTENERS, LTD., Matsumoto-shi, Nagano (JP)

(72) Inventors: Yuji Akahane, Matsumoto (JP); Makoto Aoyama, Matsumoto (JP)

(73) Assignee: TOPY FASTENERS, LTD., Matsumoto-shi, Nagano (JP)

( * ) Notice: Subject to any disclaimer, the term of this patent is extended or adjusted under 35 U.S.C. 154(b) by 167 days.

(21) Appl. No.: 15/302,770

(22) PCT Filed: Feb. 25, 2015

(86) PCT No.: PCT/JP2015/055466
§ 371 (c)(1),
(2) Date: Oct. 7, 2016

(87) PCT Pub. No.: WO2015/156047
PCT Pub. Date: Oct. 15, 2015

(65) Prior Publication Data
US 2017/0021463 A1 Jan. 26, 2017

(30) Foreign Application Priority Data
Apr. 8, 2014 (JP) ................................. 2014-079455

(51) Int. Cl.
B25B 11/02 (2006.01)
B23P 19/10 (2006.01)
(Continued)

(52) U.S. Cl.
CPC ............... B23P 19/10 (2013.01); B23P 19/04 (2013.01); B23P 19/105 (2013.01); B23P 19/12 (2013.01);
(Continued)

(58) Field of Classification Search
CPC ......... B23P 19/04; B23P 19/10; B23P 19/105; B23P 19/12; H01L 21/67265;
(Continued)

(56) References Cited

U.S. PATENT DOCUMENTS

| 8,112,878 B1* | 2/2012 | Ding | H05K 5/0004 29/760 |
|---|---|---|---|
| 2002/0198620 A1 | 12/2002 | Nomura et al. | |
| 2010/0050424 A1* | 3/2010 | Liu | H05K 13/0069 29/739 |

FOREIGN PATENT DOCUMENTS

| DE | 101 47 396 A | 1/2003 |
| JP | 1987-42929 U1 | 3/1987 |

(Continued)

OTHER PUBLICATIONS

International Search Report (PCT/ISA/210) dated Jun. 2, 2015, by the Japanese Patent Office as the International Searching Authority for International Application No. PCT/JP2015/055466.
(Continued)

*Primary Examiner* — Jermie Cozart
(74) *Attorney, Agent, or Firm* — Buchahan Ingersoll & Rooney PC (57) ABSTRACT

When plate-shaped components are inserted in the correct order and orientation into component insertion grooves of a component assembly jig, the component insertion grooves are blocked by the plate-shaped components, and the blowing of compressed air is stopped. When the blowing of compressed air from the component insertion grooves is stopped, the pressure in a compressed-air path increases, and an alignment-complete lamp is illuminated. Using the component assembly jig enables an assembly operation for overlapping the plurality of plate-shaped components in the
(Continued)

correct order and orientation, without excess or deficiency, to be efficiently performed without error.

8 Claims, 6 Drawing Sheets

(51) Int. Cl.
*B23P 19/12* (2006.01)
*B23P 19/04* (2006.01)
*H01L 21/67* (2006.01)
*H01L 21/68* (2006.01)

(52) U.S. Cl.
CPC ........ B25B 11/02 (2013.01); H01L 21/67265 (2013.01); H01L 21/68 (2013.01); *Y10T 29/49895* (2015.01); *Y10T 29/49901* (2015.01); *Y10T 29/49998* (2015.01); *Y10T 29/53061* (2015.01); *Y10T 29/53091* (2015.01); *Y10T 29/53265* (2015.01)

(58) Field of Classification Search
CPC ..... H01L 621/68; B25B 11/02; B25B 11/005; Y10T 29/53039; Y10T 29/49901; Y10T 29/49895; Y10T 29/49998; Y10T 29/53091; Y10T 29/53061; Y10T 29/53265
USPC ............... 269/289 R, 296, 301, 303, 319, 21
See application file for complete search history.

(56) References Cited

FOREIGN PATENT DOCUMENTS

| | | |
|---|---|---|
| JP | 200-136919 A | 5/2000 |
| JP | 2002-310631 A | 10/2002 |
| JP | 2003-1528 A | 1/2003 |
| JP | 2004-72067 A | 3/2004 |

OTHER PUBLICATIONS

Written Opinion (PCT/ISA/237) dated Jun. 2, 2015, by the Japanese Patent Office as the International Searching Authority for International Application No. PCT/JP2015/055466.

* cited by examiner

COMPONENT ASSEMBLY JIG

TECHNICAL FIELD

The present invention relates to a component assembly jig for use in an assembly operation in which a plurality of plate-shaped components that include differently shaped plate-shaped components are overlapped, up to a prescribed number of plate-shaped components, along the thickness direction of the plate-shaped components in a prescribed sequence and in a prescribed orientation.

BACKGROUND ART

In various industrial products, etc., there are cases when a plurality of differently shaped plate-shaped components are overlapped and tightly secured by manual operations, and a single component assembly is assembled. In such operations, when a prescribed number of the same plate-shaped components are to be overlapped, care is needed to prevent any excess or deficiency in the number of plate-shaped components. If excess or deficiency in the number of plate-shaped components is the only concern, it is easy to determine whether there is an excess or deficiency visually or by other means. However, when a plurality of differently shaped plate-shaped components are to be superposed, it is necessary to superpose the plate-shaped components in the correct sequence and in the correct orientation without excess or deficiency. In this case, it is impossible to easily distinguish whether the sequence, orientation, and number of superposed components is correct after the plate-shaped components are superposed, and the yield is typically poor.

Examination devices for examining the shape of the plate-shaped components, etc., are known in which a component to be examined is inserted into a groove corresponding to the shape of the component, and the quality of the shape is examined on the basis of the pressure state of compressed air supplied to the groove. Patent Documents 1 and 2 disclose examination devices of this configuration.

Patent Document 1: JP-A 2002-310631
Patent Document 2: JP-A 2000-136919

SUMMARY OF THE INVENTION

Problems to be Solved by the Invention

In the prior art, there has been no focus on an assembly jig for use in an operation in which a plurality of differently shaped plate-shaped components are superposed in the correct sequence and in the correct orientation, without excess or deficiency, and assembled into a single component assembly. Moreover, no such assembly jig has been proposed.

In light of the above, an object of the present invention is to provide a component assembly jig that enables an operation for superposing a plurality of differently shaped plate-shaped components in the correct sequence and in the correct orientation, without excess or deficiency, and assembling the components into a single component assembly, to be performed efficiently and without error.

Means to Solve the Problem

In order to solve the abovementioned problem, according to the present invention, there is provided a component assembly jig for use in an assembly operation in which a plurality of plate-shaped components that include differently shaped plate-shaped components are overlapped, up to a prescribed number of plate-shaped components, along the thickness direction of the plate-shaped components in a prescribed sequence and in a prescribed orientation, the component assembly jig comprising:

a jig body;
a plurality of component insertion grooves that are opened in a component insertion surface formed in the jig body;
a compressed-air channel formed inside the jig body, the compressed-air channel communicating with the exterior via each of the component insertion grooves;
a detection part for detecting, on the basis of pressure changes in the compressed air flowing through the compressed-air channel, an alignment-complete state in which the plate-shaped components are correctly inserted into each of the component insertion grooves; and
a display unit for displaying the alignment-complete state on the basis of the results of detection by the detection part; wherein
the number of the component insertion grooves formed correspond to the number of superposed plate-shaped components;
each of the component insertion grooves is formed in such a shape as to be capable of being blocked when one of the plate-shaped components to be assembled is inserted in an orientation set in advance; and
the component insertion grooves that can be blocked by the plate-shaped components are arranged in accordance with the sequence in which the plate-shaped components to be assembled are superposed.

In an assembly operation in which the component assembly jig of the present invention is used, an operator inserts corresponding plate-shaped components into each of the component insertion grooves in a state in which compressed air is made to flow through the compressed-air channel in the jig body. When the corresponding plate-shaped components are inserted into the component insertion grooves in the correct orientation, the component insertion grooves are blocked by the plate-shaped components, and the blowing of compressed air stops. When plate-shaped components are correctly inserted into all of the component insertion grooves and reach an alignment-complete state, the blowing of compressed air from the component insertion grooves stops; therefore, the pressure in the compressed-air channel, through which compressed air flows at a fixed pressure, dramatically increases. When the increase in pressure is detected by the detection part, a lamp or other display unit issues a display indicating that the alignment-complete state has been reached. The operator ascertains, from the illuminating of the lamp or the like, that the differently shaped plate-shaped components have been inserted into the component insertion grooves in the correct sequence and in the correct orientation, without excess or deficiency. Thereafter, when the plate-shaped components are extracted from the component insertion grooves while maintaining this arrangement and are superposed and fastened, a single component assembly is obtained.

A situation in which the display unit does not switch to display of the alignment-complete state, irrespective of the plate-shaped components being inserted into all of the component insertion grooves, is caused when any of the component insertion grooves is not completely blocked. Specifically, such a situation occurs in either a case in which a differently shaped plate-shaped groove is inserted into a component insertion groove (a case in which the plate-shaped components are not inserted in the correct sequence), or a case in which, although the inserted plate-shaped components are in the correct sequence, the orientation in which the plate-shaped components are inserted is incorrect. Therefore, it is possible to reliably prevent such incorrect assembly. Additionally, because plate-shaped components are inserted into each of the component insertion grooves, there is no excess or deficiency in the number of plate-shaped components being assembled.

In order to block a component insertion groove using a plate-shaped component having a corresponding shape, a configuration may be adopted in which the shape of the groove bottom surface of the component insertion groove coincides with part of the end-surface contoured shape of the plate-shaped component capable of blocking the component insertion groove, a communication opening for communicating with the compressed-air channel is formed in the groove bottom surface of the component insertion groove, the contoured shape of the groove bottom surface coincides with the contoured shape of part of the end surface of the plate-shaped component capable of blocking the component insertion groove, and the communication opening can be blocked by part of the end surface of the plate-shaped component.

In the component assembly jig of the present invention, it is preferable that: the component assembly jig comprises a plurality of spacer blocks, a plurality of grooved plates, and fastening bolts; a first groove portion having a shape corresponding to each of the component insertion grooves, and a second groove portion extending from the communication opening to the compressed-air channel, are cut into each of the grooved plates; the jig body is configured such that the spacer blocks and grooved plates are tightly secured by the fastening bolts in a state in which the spacer blocks and grooved plates are alternatingly superposed; and one component insertion groove is formed by one of the grooved plates and the spacer blocks on both sides of the grooved plate.

The grooved plates are sandwiched between the spacer blocks, whereby the component insertion grooves are formed. Therefore, when the shapes of the plate-shaped components to be assembled change, it is possible to accommodate this change by merely exchanging the grooved plates. The number of plate-shaped components to be assembled can also be increased or reduced merely by changing the number of superposed spacer blocks and grooved plates. Accordingly, it is possible to obtain an assembly jig that can be easily and inexpensively changed.

In this case, it is preferable that: first bolt through-holes for allowing the fastening bolts to pass through are formed in the grooved plates; the spacer blocks comprise two first spacer blocks arranged on both sides of the jig body, and a plurality of second spacer blocks positioned between the first spacer blocks; second bolt through-holes for allowing the fastening bolts to pass through are formed in the second spacer blocks; the compressed-air channel is formed inside the jig body by the first and second bolt through-holes; the second groove portions are linked to the first bolt through-holes; and an exterior communication opening for guiding compressed air from the exterior to the compressed-air channel is formed in one of the second spacer blocks.

Because the bolt through-holes also serve as the compressed-air channel, it is possible to easily manufacture a jig body comprising a compressed-air channel in the interior thereof by using a plurality of spacer blocks and a plurality of grooved plates.

In the component assembly jig of the present invention, it is preferable that: in a case when component openings are formed that penetrate along the thickness direction of each of the plate-shaped components, the component jig has a linear shaft member that can pass through the component openings; and the shape of the groove bottom surfaces of the component insertion grooves is set such that, when each of the plate-shaped components is inserted into the respective component insertion groove in the correct sequence and in the correct orientation, the shaft member can be made to pass through the component openings in the inserted plate-shaped components.

When the shaft member is raised after having been made to pass through the plate-shaped components, the plurality of plate-shaped components can be removed from the component insertion grooves while maintaining the aligned state. Aggregating the plate-shaped components along the shaft member also makes it possible to easily superpose the plate-shaped components. Accordingly, the operation for assembling the component assembly is facilitated.

Additionally, when it is detected that the alignment-complete state has been reached despite the plate-shaped components not being inserted into the component insertion grooves in the correct sequence and in the correct orientation due to a malfunction or the like, it is impossible to cause the shaft member to pass through the plate-shaped components after alignment. Accordingly, the operator can ascertain, from being unable to cause the shaft member to pass through, that the plate-shaped components are not correctly arranged, and that a malfunction, erroneous detection, or the like has occurred in the assembly jig.

It is preferable that: the component assembly jig has an alignment-complete gate that is capable of moving from a closed position, in which the shaft member is prevented from passing through the component openings in the plate-shaped components inserted into the component insertion grooves, and an open position, in which the shaft member is capable of being inserted; and the alignment complete gate moves from the closed position to the open position when it is detected that the completely aligned state has been reached.

Achieving a configuration as described above makes it possible to ascertain, from the movement of the alignment-complete gate, that the alignment-complete state has been obtained in the plate-shaped components.

A configuration may be adopted in which the alignment-complete gate returns to the closed position after the elapse of a prescribed period of time after having moved to the open position.

In the component assembly jig of the present invention, it is preferable that a component insertion guide for guiding the plate-shaped components into at least one of the component insertion grooves is arranged on the component insertion surface.

In the case of thin plate-shaped components, the groove width of the corresponding component insertion grooves is also reduced. Guiding the ends of thin plate-shaped components along the component insertion guide facilitates the operation for inserting the plate-shaped components into the thin component insertion grooves.

BRIEF DESCRIPTION OF THE DRAWINGS

FIGS. 4(a)-4(c2) shows side views and end views of three types of grooved plates which are constituent components of the jig body shown in FIGS. 3(a)-3(c);

MODE FOR CARRYING OUT THE INVENTION

An embodiment of a component assembly jig to which the present invention is applied is described below with reference to the drawings. FIG. 1(a) is a schematic view of the overall configuration of a component assembly jig according to the present embodiment, and FIG. 1(b) is a schematic view of plate-shaped components to be assembled using the component assembly jig. The component assembly jig 1 can be used while placed on a work table or the like, and is used in order to superpose a plurality of plate-shaped components that include differently shaped plate-shaped components in a prescribed sequence and in a prescribed orientation and produce a single component assembly. For example, as shown in FIG. 1(b), the plate-shaped components include three types of differently shaped plate-shaped components W1, W2, W3, there being four plate-shaped components W1, two plate-shaped components W2, and one plate-shaped component W3, for a total of seven plate-shaped components; these plate-shaped components are superposed in the prescribed sequence and in the prescribed orientation and tightly secured to produce a single component assembly.

As shown in FIG. 1(a), the component assembly jig 1 comprises a mount 2 made of metal plate, and the mount 2 comprises a horizontal bottom plate 3, a rear plate 4 extending vertically upward from the rear end of the bottom plate 3, and a top plate 5 bent rearward at a right angle from the upper end of the rear plate 4. A jig body 6 assuming the overall shape of a rectangular prism is mounted on the bottom plate 3. An alignment-complete gate 7 is arranged on one rear-end-part side (a location on the left side when the component assembly jig 1 is viewed from the front) of the jig body 6. The alignment complete gate 7 is capable of moving, due to a plunger 8 attached to the rear plate 4 of the mount 2, from a closed position (forward in FIG. 1(a)) to an open position retracted toward the rear plate 4. An alignment-complete lamp 9 is mounted on the top plate 5 of the mount 2 as a display unit.

A compressed-air supply part 10, for causing compressed air supplied from an external compressed-air supply source (not shown) to flow through a compressed-air channel (see FIGS. 3(a)-3(c)) formed inside the jig body 6, is attached to the rear-surface side of the rear plate 4 of the mount 2, as indicated by dotted lines. The compressed-air supply part 10 comprises an air supply tube, an open/close valve, a pressure-adjusting valve, a pressure gauge, and other constituent components. A control panel 11 is also attached to the rear-surface side of the rear plate 4, as indicated by dotted lines. The control panel 11 controls the flashing of the alignment-complete lamp 9 on the basis of the pressure detected by the pressure gauge. Additionally, a control is performed to drive the plunger 8 so as to cause the alignment-complete gate 7 to move from the closed position to the open position on the basis of the pressure, and to drive the plunger 8 so as to return the alignment-complete gate 7 from the open position to the closed position on the basis of a time count carried out by a built-in timer.

Figure 2:
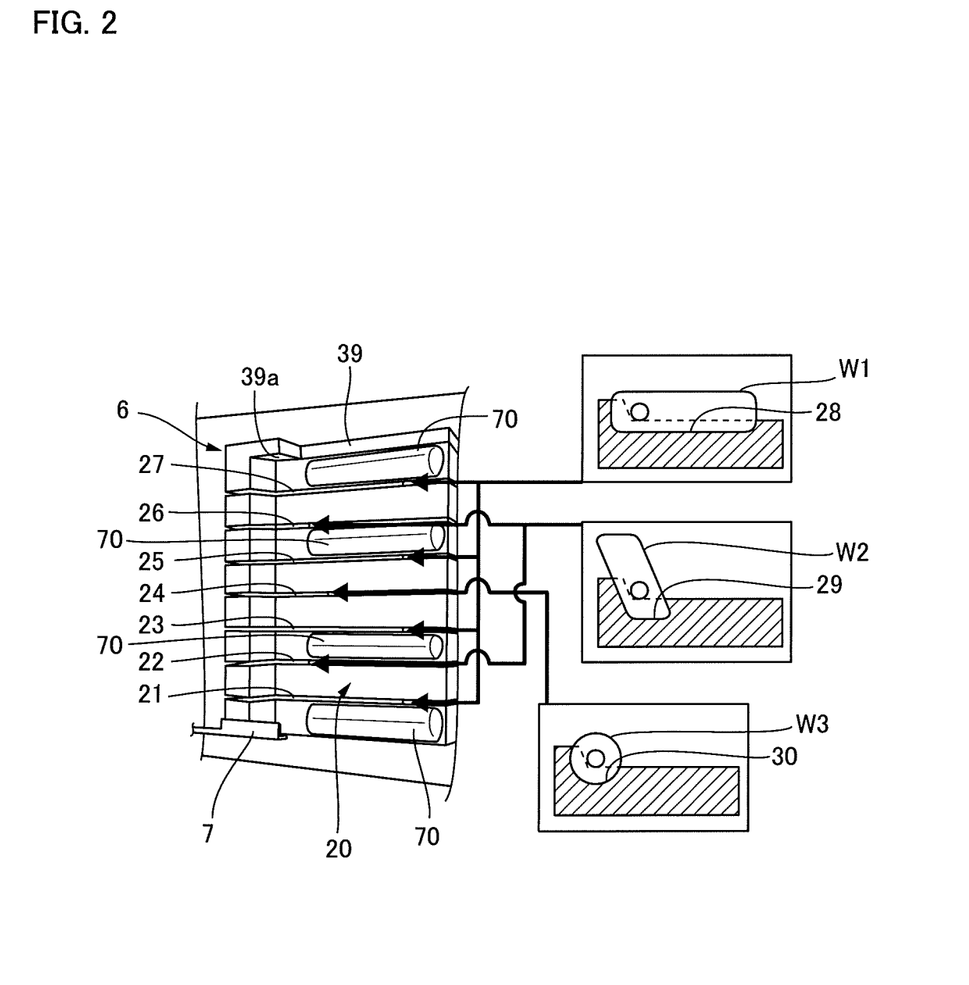
FIG. 2 is a schematic view of a component insertion surface, the groove shape of component insertion grooves, and the shape of plate-shaped components to be inserted in the component assembly jig shown in FIGS. 1(a) and 1(b)

FIG. 2 is a schematic view of a component insertion surface, the groove shape of component insertion grooves, and the shape of plate-shaped components to be inserted in the jig body 6 of the component assembly jig 1. The jig body 6 assumes the overall shape of a rectangular prism, and a component insertion surface 20 is formed in the upper surface thereof. The component insertion surface 20 is a flat stepped surface of which only the rear-end part is raised; seven component insertion grooves 21-27 are formed in the jig body 6 so as to open in the component insertion surface 20. The component insertion grooves 21-27 are grooves of a fixed width that extend linearly along the longitudinal direction. In the present example, the component insertion grooves 21-27 are formed in parallel at fixed intervals; however, it is not necessary for the component insertion grooves to be formed to have a fixed width, or to be parallel to each other, and the number of grooves is not limited to seven. These features are changed, as appropriate, in accordance with the shape, number, and other attributes of the plate-shaped components to be assembled.

The component insertion grooves 21-27, in order from the left side, are referred to as first through seventh component insertion grooves. Four of the component insertion grooves, including the first, third, fifth, and seventh component insertion grooves 21, 23, 25, 27, are of the same shape. In order to insert the plate-shaped components W1 into these component insertion grooves 21, 23, 25, 27, the groove bottom surfaces 28 are formed in a contoured shape that coincides with part of the end-surface contoured shape of the plate-shaped components W1. The second and sixth component insertion grooves 22, 26 are of the same shape as each other. In order to insert the plate-shaped components W2 into these component insertion grooves 22, 26, the groove bottom surfaces 29 are formed in a contoured shape that coincides with part of the end-surface contoured shape of the plate-shaped components W2. In order to insert the plate-shaped component W3 into the remaining fourth component insertion groove 24, the groove bottom surface 30 is formed in a contoured shape that coincides with part of the end-surface contoured shape of the plate-shaped component W3. Therefore, when the corresponding plate-shaped components W1-W3 are inserted into the first through seventh component insertion grooves 21-27 in the correct orientation, the end-surface portions of the inserted plate-shaped components W1-W3 reach a state of securely fitting into the respective groove bottom surfaces 28, 29, 30.

In the present example, four component insertion guides 70 are attached to the component insertion surface 20. The component insertion guides 70 are rod-shaped bodies that are substantially semicircular in cross-section, the component insertion guides 70 being respectively attached at the left side of the first component insertion groove 21, between the second and third component insertion grooves 22, 23, between the fifth and sixth component insertion grooves 25, 26, and at the right side of the seventh component insertion groove 27. The component insertion guides 70 are attached to the component insertion surface 20 in a state in which the semicircular arcuate guide surfaces are oriented upward; insertion of the plate-shaped components W1, W2 into the first, second, third, fifth, sixth, and seventh component insertion grooves 21, 22, 23, 25, 26, 27 is guided by the arcuate guide surfaces. As shall be apparent, although a component insertion guide can also be arranged for the fourth component insertion groove 24, the plate-shaped component W3 to be inserted thereinto is smaller than the other plate-shaped components W1, W2 in the present example, and thus insertion is relatively easy; therefore, such a component insertion guide is omitted. The shape of the component insertion guides may be different from that described in the present example.

Figure 3:
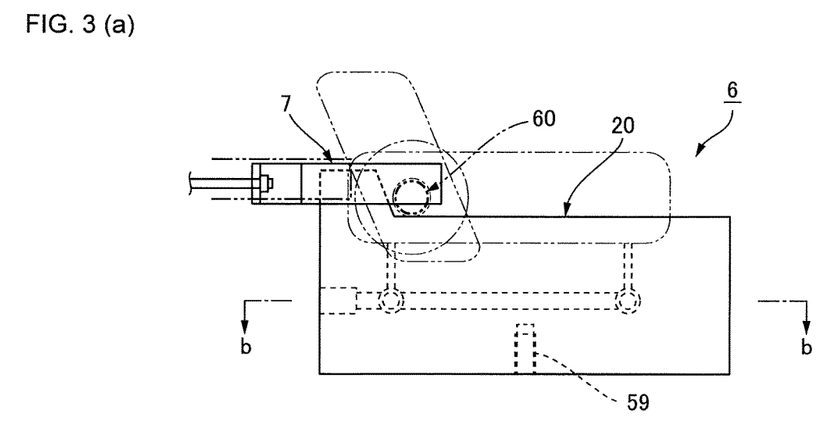
FIGS. 3(a)-3(c) are side views of the jig body, a transverse cross-sectional view of the interior structure, and a schematic view of a shaft member of the component assembly jig shown in FIGS. 1(a) and 1(b)

FIG. 3(*a*) is a side view of the jig body 6, FIG. 3(*b*) is a transverse cross-sectional view of a portion taken along line b-b in FIG. 3(*a*), and FIG. 3(*c*) is a schematic view of a shaft member capable of passing through the plate-shaped components W1, W2, W3. The jig body 6 is configured from, e.g., first through eighth spacer blocks 31-38 comprising plates of fixed thickness that assume the shape of an oblate rectangular prism, an end plate 39 comprising a plate of fixed thickness that assumes the shape of an oblate rectangular prism, first through seventh grooved plates 41-47, and two fastening bolts 48, 49. The first through eighth spacer blocks 31-38 and the first through seventh grooved plates 41-47 are alternatingly superposed from the left side, and the end plate 39 is superposed on the right side of the eighth spacer block 38; the jig body 6 is configured such that these members are tightly secured by the fastening bolts 48, 49, which pass through from the width direction, while in this state.

Figure 1:
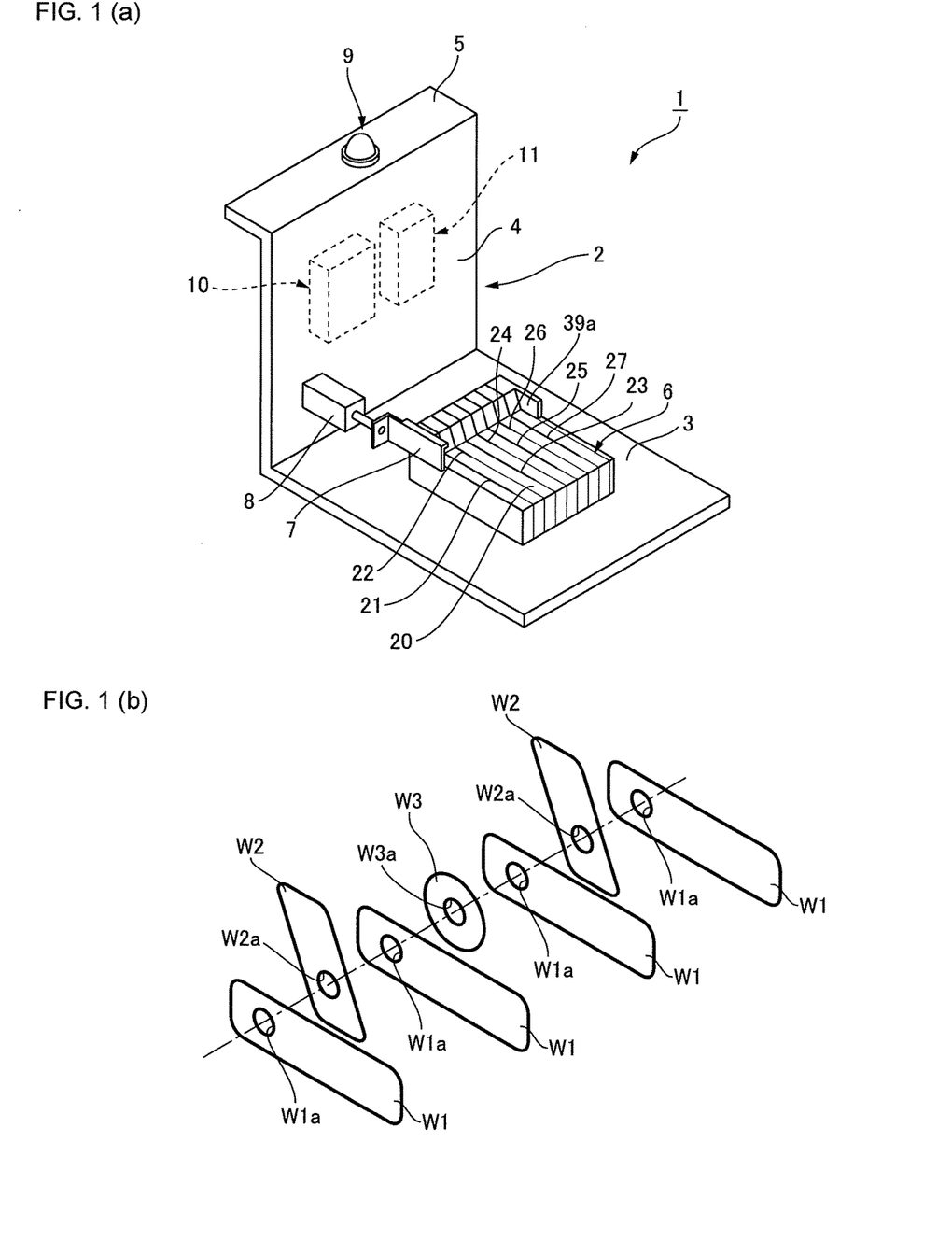
FIGS. 1(a) and 1(b) are schematic view of the overall configuration of a component assembly jig to which the present invention is applied, and a schematic view of plate-shaped components to be assembled.

Bolt holes 31*a*, 31*b* in which the fastening bolts 48, 49 can be screwed and secured are formed in the first spacer block 31 from the left at positions that are set apart from each other in the longitudinal direction. Bolt through-holes 48*a*, 49*a* that are slightly larger than the fastening bolts 48, 49 are formed at corresponding positions in each of the second through eighth spacer blocks 32-38, the end plate 39, and the first through seventh grooved plates 41-47. Additionally, compressed-air channels 51, 52 extending along the longitudinal direction are formed in the second and seventh spacer blocks 32, 37, respectively. The compressed-air channels 51, 52 communicate with the front and rear bolt through-holes 48*a*, 49*a*, the rear-end surfaces of the compressed-air channels 51, 52 being configured as exterior communication openings 51*a*, 52*a* that are open to the exterior. Piping (not shown) for the compressed air channel is formed in the exterior communication openings 51*a*, 52*a*, the piping extending from the compressed-air supply part 10 (see FIG. 1(*a*)) arranged on the rear-surface side of the mount 2.

As shown in FIG. 3(*a*), bolt holes 59 are formed in the second and seventh spacer blocks 32, 37 so as to be perpendicular to the bottom surfaces thereof. The jig body 6 is tightly secured to the bottom plate 3 by fastening bolts (not shown) screwed into the bolt holes 59 from the bottom plate 3 of the mount 2.

Figure 4:
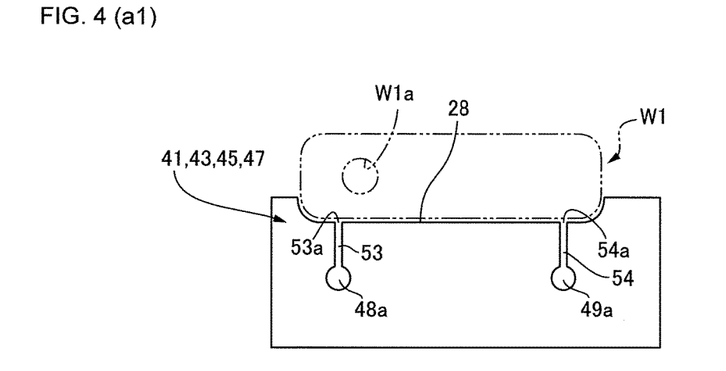

FIGS. 4(*a*)-4(*c*2) are set of side views and end views of the first through seventh grooved plates 41-47. As shown in FIG. 4(*a*1), grooves are cut into the first, third, fifth, and seventh grooved plates 41, 43, 45, 47 such that groove bottom surfaces 28 corresponding to the first plate-shaped components W1 are formed. Additionally, communication grooves 53, 54 (second communication grooves) of fixed width are cut into the groove bottom surfaces 28 so as to extend downward from positions that are set apart from each other toward the front and rear, the communication grooves 53, 54 communicating with the bolt through-holes 48*a*, 49*a*, and two communication holes 53*a*, 54*a* are opened to the front and rear of the groove bottom surfaces 28.

Similarly, as shown in FIG. 4(*b*1), grooves are also cut into the second and sixth grooved plates 42, 46 such that groove bottom surfaces 29 corresponding to the second plate-shaped components W2 are formed. Communication grooves 55, 56 of fixed width are cut into the groove bottom surfaces 29 so as to extend downward from positions that are set apart from each other toward the front and rear, the communication grooves 55, 56 communicating with the bolt through-holes 48*a*, 49*a*, and two communication holes 55*a*, 56*a* are opened to the front and rear of the groove bottom surfaces 29. Additionally, as shown in FIG. 4(*c*1), a groove is also cut into the remaining fourth grooved plate 44 such that a groove bottom surface 30 corresponding to the third plate-shaped component W3 is formed. Communication grooves 57, 58 of fixed width are cut into the groove bottom surface 30 so as to extend downward from positions that are set apart from each other toward the front and rear, the communication grooves 57, 58 communicating with the bolt through-holes 48*a*, 49*a*, and two communication holes 57*a*, 58*a* are opened to the front and rear of the groove bottom surface 30.

Therefore, in the jig body 6, which is configured such that the first through eighth spacer blocks 31-38, end plate 39, and first through seventh grooved plates 41-47 are alternatingly superposed and fastened, first through seventh component insertion grooves 21-27 are formed by each of the seven grooved plates 41-47 and the first through eighth spacer blocks 31-38 arranged on both sides thereof.

Additionally, two compressed-air channels extending along the width direction are formed by the bolt through-holes 48*a*, 49*a*, the compressed-air channels communicating with two compressed-air channels 51, 52 extending along the longitudinal direction. The bolt through-holes 48*a*, 49*a* also communicate with the first through seventh component insertion grooves 21-27. Accordingly, when compressed air is supplied from the exterior to the compressed-air channels, the compressed air is blown to the exterior via the first through seventh component insertion grooves 21-27.

Each of the plate-shaped components W1-W3 to be assembled has formed therein a component opening W1*a*-W3*a* that passes through along the thickness direction thereof, as shall be apparent from FIGS. 1(*b*) and 4. In the present example, the groove-bottom-surface shapes of the component insertion grooves 21-27 are set such that, when each of the plate-shaped components W1-W3 is inserted in the correct sequence and in the correct orientation into the respective first through seventh component insertion grooves 21-27, the component openings W1*a*-W3*a* in the inserted plate-shaped components W1-W3 coincide with each other. Specifically, the shapes of the groove bottom surfaces 28, 29, 30 of the component insertion grooves are set such that a linear shaft member 60 of circular cross-section shown in FIG. 3(*c*) can pass through along the width direction, as indicated by the virtual lines in FIG. 3(*a*).

In the present example, the alignment-complete gate 7 is arranged on the left-side end of the jig body 6, at a location at which the component openings W1*a*-W3*a* coincide. When the alignment-complete gate 7 is in the closed position indicated by solid lines in FIG. 3(*a*), the shaft member 60 cannot pass through the component openings W1*a*-W3*a*. However, when the alignment complete gate 7 retracts to the open position indicated by virtual lines, the shaft member 60 can pass through the component openings W1*a*-W3*a* from the lateral direction. In the present example, as shall be apparent from FIGS. 1(*a*) and 2, a stopper end surface 39*a* is formed on the rear-end portion of the end plate 39 arranged on the right-side end, the stopper end surface 39*a* protruding further forward than the other first through eighth spacer blocks 31-38. Bringing the distal end of the shaft member 60, which has passed through the component openings W1a-W3a, into contact with the stopper end surface 39a makes it possible for an operator to reliably ascertain that the shaft member 60 has passed through.

Figure 5:
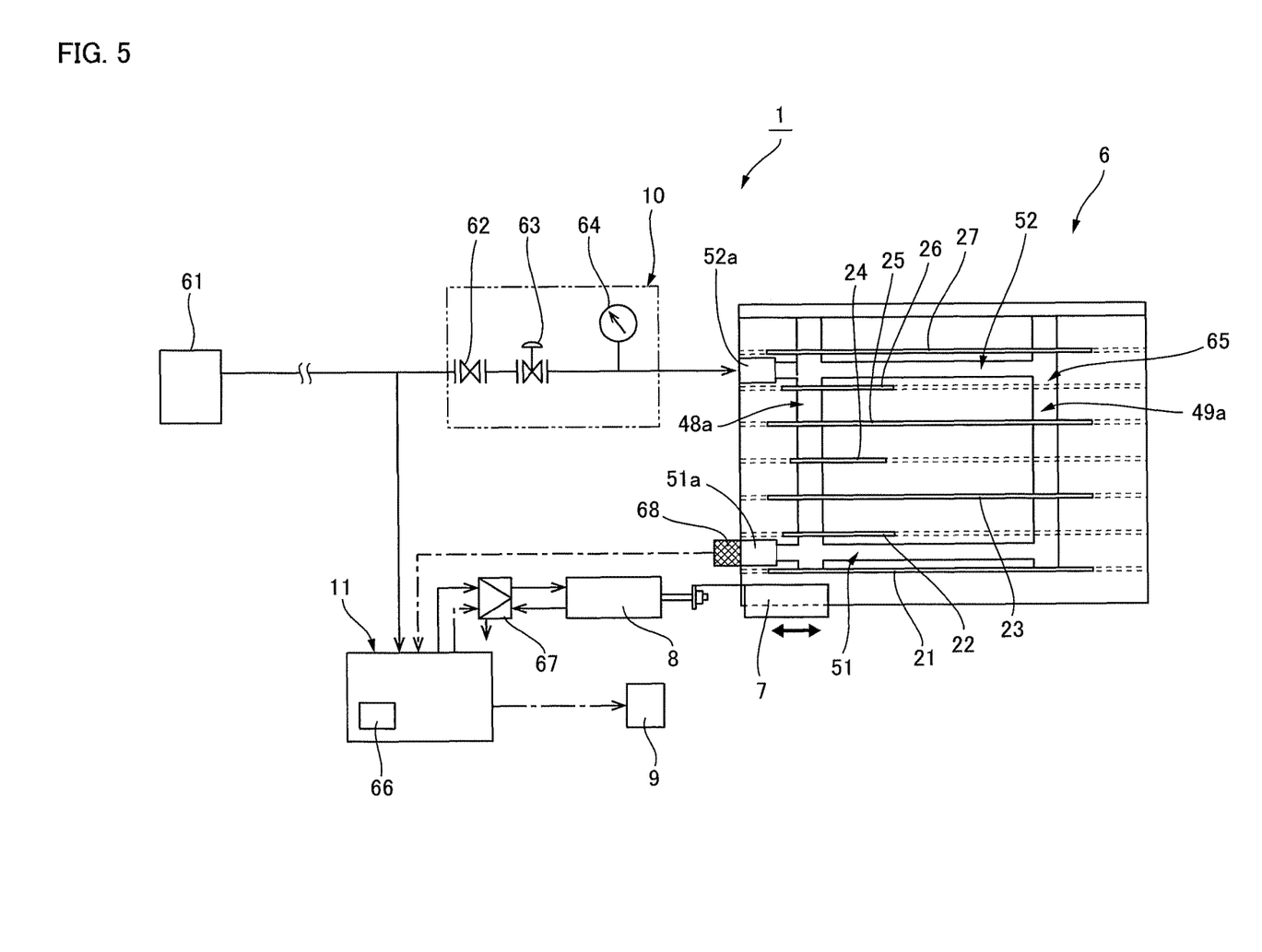
FIG. 5 is a block diagram of the control system of the component assembly jig shown in FIGS. 1(a) and 1(b)

FIG. 5 is a schematic block diagram of the drive control system of the component assembly jig 1. In FIG. 5, the compressed-air channels are indicated by solid lines, and electric-signal channels are indicated by chain lines. As shown in FIG. 5, compressed air is supplied from an external compressed-air supply source 61 to the compressed-air supply part 10 of the component assembly jig 1. The compressed-air supply part 10 comprises an open/close valve 62, a pressure-adjusting valve 63, and a pressure gauge 64, the compressed-air supply part 10 supplying compressed air via one exterior communication opening 52a to compressed-air channels 65 (51, 52, 48a, 49a) formed inside the jig body 6. The pressure of the compressed air supplied to the compressed-air channels 65 is detected by the pressure gauge 64. A pressure sensor 68 is attached to the other exterior communication opening 51a of the jig body 6, the exterior communication opening 51a being blocked. The pressure within the compressed-air channels 65 inside the jig body 6 is detected by the pressure sensor 68.

The control panel 11 lights the alignment-complete lamp 9 when the detected pressure detected by the pressure sensor 68 exceeds a set pressure set in advance. An action for opening the alignment-complete gate 7 is carried out by switching a solenoid valve 67 and driving the air-drive-type plunger 8. Furthermore, the control panel 11 initiates a time count, using a built-in timer 66, from the point in time at which the alignment-complete gate 7 is opened. When the time count is counted up to a predetermined time; e.g., 20 seconds, the alignment-complete lamp 9 is extinguished, and an action for closing the alignment gate 7 is carried out by switching the solenoid valve 67 and driving the plunger 8.

Figure 6:
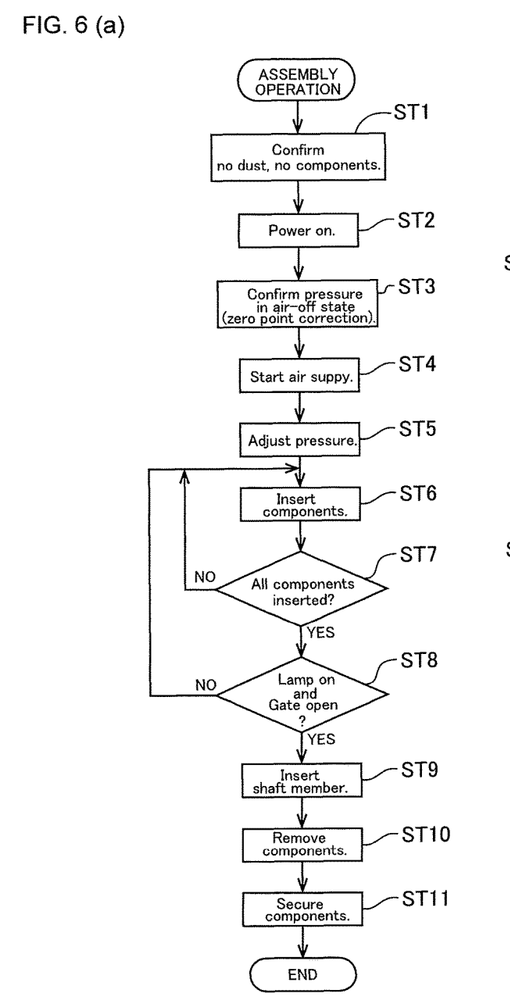
FIGS. 6(a) and 6(b) shows schematic flowcharts indicating the operating procedures, and the actions carried out by the component assembly jig, in a component assembly operation in which the component assembly jig shown in FIGS. 1(a) and 1(b) is used.

FIG. 6(a) is a schematic flowchart indicating the operating procedures in an operation for assembling the plate-shaped components W1-W3 in which the component assembly jig 1 is used, and FIG. 6(b) is a schematic flowchart indicating the actions carried out by the component assembly jig 1. The assembly operation is described below with reference to FIGS. 6(a) and 6(b). First, an operator visually confirms the jig body 6 of the component assembly jig 1, confirming that no foreign matter or incorrect parts are present (step ST1 in FIG. 6(a)). In particular, it is confirmed that no dust or the like is present in the component insertion grooves 21-27, and cleaning is performed by air-blowing, etc., as necessary. After an electricity source is turned on (step ST2 in FIG. 6(a)), it is confirmed, from a display of the pressure gauge 64 on the rear surface, that the pressure value is zero in a state in which the air is off (step ST3 in FIG. 6(a)). In a case in which zero is not displayed, correction is carried out. The open/close valve 62 is then opened to introduce compressed air (step ST4 in FIG. 6(a)), the pressure-adjusting valve 63 is manipulated to set the pressure of the supplied compressed air (step ST5 in FIG. 6(a)).

Thereafter, an operation is initiated for inserting the plate-shaped components W1-W3 into the seven component insertion grooves 21-27 (step ST6 in FIG. 6(a)). When the corresponding plate-shaped components W1-W3 are inserted into the component insertion grooves 21-27, the communication holes 53a-58a opened in the groove bottom surfaces 28-30 are blocked by the end surfaces of the inserted plate-shaped components W1-W3. This prevents the flow of compressed air being blown from the component insertion grooves 21-27 to the exterior, eliminates leakage to the exterior, and increases the pressure of the compressed air flowing through the compressed-air channels formed inside the jig body 6.

After the component insertion operation ends (step ST7 in FIG. 6(a)), when the plate-shaped components W1-W3 are inserted in the correct sequence and in the correct orientation into the respective component insertion grooves 21-27, the internal pressure of the compressed-air channels rises to a value exceeding a set pressure. When the rising of the internal pressure is detected from a detection signal from the pressure sensor 68 (step ST12 in FIG. 6(b)), the control panel 11 determines that the seven plate-shaped components W1-W3 have reached an alignment-complete state in which the plate-shaped components W1-W3 are inserted in the correct sequence and in the correct orientation without excess or deficiency, lights the alignment-complete lamp 9, and opens the alignment-complete gate 7 (steps ST13a and ST13b in FIG. 6(b)).

The operator ascertains, from the illuminating of the alignment-complete lamp 9 and the opening of the alignment-complete gate 7, that the plate-shaped components W1-W3 are correctly oriented (step ST8 in FIG. 6(a)). The shaft member 60 is then passed through the component openings W1a-W3a in the plate-shaped components W1-W3 (step ST9 in FIG. 6(a)). Raising the shaft member 60 above the jig body 6 makes it possible to remove the seven plate-shaped components W1-W3 from the component insertion grooves 21-27 while maintaining the aligned state (step ST10 in FIG. 6(a)). The seven plate-shaped components W1-W3 are then aggregated and superposed on each other along the shaft member 60 and tightly secured by prescribed fasteners, and a single component assembly is produced (step ST11 in FIG. 6(a)).

When the time count reaches a predetermined time; e.g., 20 seconds from the point in time at which the alignment complete gate 7 is opened, the control cover 11 extinguishes the alignment-complete lamp 9, and carries out an action for closing the alignment-complete gate 7 (steps ST14, ST15a, and ST15b in FIG. 6(b)).

The invention claimed is:

1. A component assembly jig for use in an assembly operation in which a plurality of plate-shaped components that include differently shaped plate-shaped components are overlapped, up to a prescribed number of plate-shaped components, along a thickness direction of the plate-shaped components in a prescribed sequence and in a prescribed orientation, the component assembly jig comprising:
   a jig body;
   a plurality of component insertion grooves that are opened in a component insertion surface formed in the jig body;
   a compressed-air channel formed inside the jig body, the compressed-air channel communicating with an exterior via each of the component insertion grooves;
   a detection part for detecting, on the basis of pressure changes in a compressed air flowing through the compressed-air channel, an alignment-complete state in which the plate-shaped components are correctly inserted into each of the component insertion grooves; and
   a display unit for displaying the alignment-complete state on the basis of results of detection by the detection part;
   wherein
   a number of the component insertion grooves formed correspond to the prescribed number of superposed plate-shaped components;

each of the component insertion grooves is formed in such a shape as to be capable of being blocked when one of the plate-shaped components to be assembled is inserted in the prescribed orientation; and the component insertion grooves that can be blocked by the plate-shaped components are arranged in accordance with the prescribed sequence in which the plate-shaped components to be assembled are superposed.

2. The component assembly jig according to claim 1, wherein a shape of a groove bottom surface of the component insertion groove coincides with part of an end-surface contoured shape of the plate-shaped component capable of blocking the component insertion groove, a communication opening for communicating with the compressed-air channel is formed in the groove bottom surface of the component insertion groove, and the communication opening can be blocked by part of the end surface of the plate-shaped component, the part of the end surface being capable of blocking the component insertion groove that has the groove bottom surface formed with the communication opening.

3. The component assembly jig according to claim 2, further comprising:

a plurality of spacer blocks; a plurality of grooved plates; and fastening bolts; wherein a first groove portion having a shape corresponding to each of the component insertion grooves, and a second groove portion extending from the communication opening to the compressed-air channel, are cut into each of the grooved plates;

the jig body is configured such that the spacer blocks and grooved plates are tightly secured by the fastening bolts in a state in which the spacer blocks and grooved plates are alternatingly superposed; and one component insertion groove is formed by one of the grooved plates and the spacer blocks on both sides of the grooved plate.

4. The component assembly jig according to claim 3, wherein first bolt through-holes for allowing the fastening bolts to pass through are formed in the grooved plates;

the spacer blocks comprise two first spacer blocks arranged on both sides of the jig body, and a plurality of second spacer blocks positioned between the first spacer blocks;

second bolt through-holes for allowing the fastening bolts to pass through are formed in the second spacer blocks;

the compressed-air channel is formed inside the jig body by the first and second bolt through-holes;

the second groove portions are linked to the first bolt through-holes; and an exterior communication opening for guiding the compressed air from the exterior to the compressed-air channel is formed in one of the second spacer blocks.

5. The component assembly jig according to claim 2, wherein component openings are formed that penetrate along the thickness direction of each of the plate-shaped components, the component jig has a linear shaft member that can pass through the component openings; and the shape of the groove bottom surfaces of the component insertion grooves is set such that, when each of the plate-shaped components is inserted into the respective component insertion groove in the correct sequence and in the correct orientation, the shaft member can be made to pass through the component openings in the inserted plate-shaped components.

6. The component assembly jig according to claim 5, further comprising:

an alignment-complete gate that is capable of moving from a closed position, in which the shaft member is prevented from passing through the component openings in the plate-shaped components inserted into the component insertion grooves, and an open position, in which the shaft member is capable of being inserted; wherein the alignment-complete gate moves from the closed position to the open position when it is detected that the alignment-complete state has been reached.

7. The component assembly jig according to claim 6, wherein the alignment-complete gate returns to the closed position after an elapse of a prescribed period of time after having moved to the open position.

8. The component assembly jig according to claim 1, further comprising:

a component insertion guide for guiding the plate-shaped components into at least one of the component insertion grooves is arranged on the component insertion surface.

* * * * *